United States Patent
Yamashita

(10) Patent No.: US 10,241,155 B2
(45) Date of Patent: Mar. 26, 2019

(54) INSPECTION METHOD FOR ALL-SOLID SECONDARY BATTERY AND MANUFACTURING METHOD OF ALL-SOLID SECONDARY BATTERY UTILIZING THE INSPECTION METHOD

(71) Applicant: TOYOTA JIDOSHA KABUSHIKI KAISHA, Toyota-shi, Aichi-ken (JP)

(72) Inventor: Yuji Yamashita, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 156 days.

(21) Appl. No.: 15/211,754

(22) Filed: Jul. 15, 2016

(65) Prior Publication Data

US 2017/0023648 A1  Jan. 26, 2017

(30) Foreign Application Priority Data

Jul. 22, 2015 (JP) .................................. 2015-144879

(51) Int. Cl.
  *G01R 31/36*  (2019.01)
  *H01M 10/0525*  (2010.01)
  (Continued)

(52) U.S. Cl.
  CPC ..... *G01R 31/3627* (2013.01); *G01R 31/3658* (2013.01); *G01R 31/3665* (2013.01);
  (Continued)

(58) Field of Classification Search
  CPC ............ G01R 31/3627; G01R 31/3658; G01R 31/3665; H01M 10/0525; H01M 10/0562; H01M 10/058
  (Continued)

(56) References Cited

U.S. PATENT DOCUMENTS

| 3,840,408 A | * | 10/1974 | Bondley | ............... H01M 2/065 174/152 GM |
| 2010/0216030 A1 | * | 8/2010 | Maeda | ............... H01M 4/366 429/319 |

FOREIGN PATENT DOCUMENTS

| JP | 2000030764 | * | 1/2000 | ............. G01R 31/36 |
| JP | 2013242324 A | * | 12/2013 | ............. G01R 31/36 |

(Continued)

OTHER PUBLICATIONS

NASA Preferred Reliability Practices: Short Circuit Testing for Nickel/Hydrogen Battery Cells, Pact. No. PT-TE-1430, Oct. 1995, pp. 1-8.*

(Continued)

*Primary Examiner* — Melissa Koval
*Assistant Examiner* — Courtney McDonnough
(74) *Attorney, Agent, or Firm* — Oliff PLC

(57) ABSTRACT

A method for inspecting a constituent unit cell to be stacked in an all-solid secondary battery of the present disclosure includes (A) measuring an open-circuit voltage between the positive electrode and the negative electrode of a constituent unit cell before a short-circuiting step is performed, (B) temporarily short-circuiting the positive electrode and the negative electrode of the constituent unit cell, (C) measuring an open-circuit voltage between the positive electrode and the negative electrode of the constituent unit cell after a given time has elapsed since the end of step (B), and (D) judging the constituent unit cell to be unusable when the open-circuit voltage measured in step (C) is less than a threshold value. A method for manufacturing an all-solid secondary battery of the present disclosure includes stacking a plurality of constituent unit cells excluding constituent unit cells judged to be unusable by the above inspection method.

4 Claims, 4 Drawing Sheets

(51) Int. Cl.
*H01M 10/0562* (2010.01)
*H01M 10/058* (2010.01)
*H01M 10/48* (2006.01)

(52) U.S. Cl.
CPC ..... *H01M 10/058* (2013.01); *H01M 10/0525* (2013.01); *H01M 10/0562* (2013.01); *H01M 10/48* (2013.01); *H01M 2300/0068* (2013.01)

(58) Field of Classification Search
USPC ......................................................... 324/426
See application file for complete search history.

(56) References Cited

FOREIGN PATENT DOCUMENTS

| JP | 2014022217 A | 2/2014 |
|---|---|---|
| JP | 2014222603 A | 11/2014 |

OTHER PUBLICATIONS

Espacenet—Translated Jan. 27, 2018 of JP2000030764 A.*
Espacenet Translated JP2013242324 (A) Dec. 5, 2013.*
Prasad et al. Open circuit voltage recovery of discharged and shorted nickel-cadmium cells, Journal of Applied Electrochemistry 17 (1987) 463-472.*
"General Specification of Lithium-Ion Cells and Batteries for Mobile Phones"; The State Standard of the People'S Republic of China; GB/T 18287-2013; Jul. 19, 2013.
Yuping et al; "Lithium Ion Secondary Battery;" Chemical Industry Press and Materials Science and Engineering Press; Nov. 30, 2002; pp. 215.
Introduction to New Chemical Power Supply Technology; edited by Guo-Xin Li; Shanghai Science and Technology Publishing Co., Ltd.; ISBN No. 7-5323-8863-8; published on May 31, 2007.
Translation of Oct. 31, 2018 Office Action Issued in Chinese Patent Application No. 201610569090.05.

* cited by examiner

SHORT-CIRCUIT/FINE SHORT-CIRCUIT INSPECTION OF A CELL

INSPECTION METHOD FOR ALL-SOLID SECONDARY BATTERY AND MANUFACTURING METHOD OF ALL-SOLID SECONDARY BATTERY UTILIZING THE INSPECTION METHOD

TECHNICAL FIELD

The present invention relates to a method for inspecting an all-solid secondary battery and a method for manufacturing an all-solid secondary battery by utilizing the inspection method.

BACKGROUND ART

At present, among various batteries, a lithium ion battery is attracting attention from the standpoint that the energy density is high. Above all, the attention is focused on an all-solid secondary battery in which an electrolytic solution is replaced by a solid electrolyte. The reason therefor is that unlike a secondary battery using an electrolytic solution, the all-solid secondary battery using no electrolytic solution does not cause decomposition, etc. of an electrolytic solution attributable to overcharge and has high cycle durability and high energy density.

Meanwhile, it is known that when a secondary battery is charged and left standing, the electromotive force decreases. One of causes thereof is a self-discharge due to a minor short circuit, etc. formed inside the battery. In view of battery efficiency, the self-discharge amount is preferably small. To cope with this, there is known a manufacturing method where a battery manufactured is measured for the self-discharge amount and a battery unsuitable for a product is eliminated to maintain the quality of the whole product.

Specific examples of the method for inspecting the self-discharge amount of a battery include the method of Patent Document 1. In addition, specific examples of the method for manufacturing a battery including a method for inspecting the self-discharge amount of a battery include the method of Patent Document 2. Both methods of Patent Documents 1 and 2 relate to a battery using an electrolytic solution.

Specifically, in Patent Document 1, with respect to a solid secondary battery using an electrolytic solution, the open-circuit voltage of a battery after charging the battery is measured, the battery is constant-voltage charged such that the measured open-circuit voltage is maintained, and the self-discharge amount is calculated from the amount of current necessary for maintaining the open-circuit voltage at the time of constant voltage charge.

In Patent Document 2, with respect to a solid secondary battery using an electrolytic solution, initial charge is performed after the completion of assembly but before shipping the product, and then self-discharge inspection is performed. In the case where a minor short circuit is detected in the battery inspected, recharge/discharge is performed so as to remove the minor short circuit.

RELATED ART

Patent Document

[Patent Document 1] JP2014-222603A
[Patent Document 2] JP2014-022217A

SUMMARY OF THE INVENTION

Problems to be Solved by the Invention

The inspection method of Patent Document 1 and the manufacturing method of Patent Document 2 are effective when applied to a secondary battery using an electrolytic solution contemplated in both documents. However, when they are applied to an all-solid secondary battery having multi-stacked constituent unit cells, a trouble is brought about.

Specifically, the method of Patent Document 1 is a method of judging the presence or absence of a minor short circuit inside a battery by performing initial charge after completing the battery, and then measuring the self-discharge amount. In this method, the presence or absence of a minor short circuit inside a battery can be inspected only after completing the battery. If the method of Patent Document 1 is used for a multi-layer lithium ion secondary battery, when a minor short circuit is formed in part of constituent unit cells out of multi-stacked constituent unit cells, it is decided by the self-discharge inspection after completing the battery that a minor short circuit exists inside the battery. Therefore, in the case of using the method of Patent Document 1 for an all-solid secondary battery, out of multi-stacked constituent unit cells, those not forming a minor short circuit are wasted at the time of manufacture of a battery, resulting in poor production efficiency. If there is a method for deciding the presence or absence of a minor short circuit in each constituent unit cell before completing a battery, and eliminating a cell with a minor short circuit from the manufacturing process, the production efficiency can be enhanced.

The manufacturing method of Patent Document 2 utilizes a method where the presence or absence of a minor short circuit inside a battery is inspected after completing the battery and when a minor short circuit is judged to exist, the battery is recharged/discharged so as to remove the minor short circuit. This method follows the principle of, with respect to a minor short circuit caused by a conductive crystal such as lithium precipitated inside a battery, removing the conductive crystal such as lithium by recharge/discharge. The minor short circuit of an all-solid secondary battery is caused by the absence, etc. of a solid electrolyte layer and differs in the cause from the minor short circuit of a battery using an electrolytic solution and therefore, it is difficult to remove a minor short circuit by recharge/discharge. Accordingly, the manufacturing method of Patent Document 2 cannot be used for an all-solid secondary battery.

An object of the present invention is to provide a method for inspecting the presence or absence of a minor short circuit in a constituent unit cell before forming an all-solid secondary battery and a manufacturing method of an all-solid secondary battery, in which the production efficiency is enhanced by performing the inspection method in the manufacturing process.

Means to Solve the Problems

The present inventors have found that the above-described object can be attained by the following means.

1. A method for inspecting a constituent unit cell of an all-solid secondary battery, comprising:
(A) measuring an open-circuit voltage between the positive electrode and the negative electrode of said constituent unit cell of said all-solid secondary battery, (B) externally short-circuiting the positive electrode and the negative electrode of the constituent unit cell, (C) measuring an open-circuit voltage between the positive electrode and the negative electrode of the constituent unit cell after a given time has elapsed since the end of step (B), and (D) judging the constituent unit cell to be unusable when the open-circuit voltage measured in step (C) is less than the threshold value.

2. The method according to claim 1, wherein the electrolyte of said all-solid secondary battery is a sulfide solid electrolyte.

3. A method for manufacturing an all-solid secondary battery, including stacking a plurality of constituent unit cells excluding a constituent unit cell judged to be unusable by the judgment method according to 1 or 2 above.

Effects of the Invention

According to the present invention, a method for inspecting the presence or absence of a minor short circuit in a constituent unit cell before forming an all-solid secondary battery and a manufacturing method of an all-solid secondary battery, in which the production efficiency is enhanced by performing the inspection method in the manufacturing process, can be provided.

MODE FOR CARRYING OUT THE INVENTION

The mode for carrying out the present invention is described in detail below. The present invention is not limited to the following embodiments and can be implemented by making various modifications therein within the scope of the gist of the present invention.

1. Inspection Method (1) Inspection Method of the Present Invention

The inspection method of the present invention is a method for inspecting a constituent unit cell of an all-solid secondary battery, comprising externally short-circuiting the positive electrode and the negative electrode of a constituent unit cell of an all-solid secondary battery, measuring an open-circuit voltage between the positive electrode and the negative electrode of the constituent unit cell after a given time has elapsed since the end of the externally short-circuiting, and judging the constituent unit cell to be unusable when the open-circuit voltage measured after the externally short-circuiting is less than the threshold value.

Figure 2:
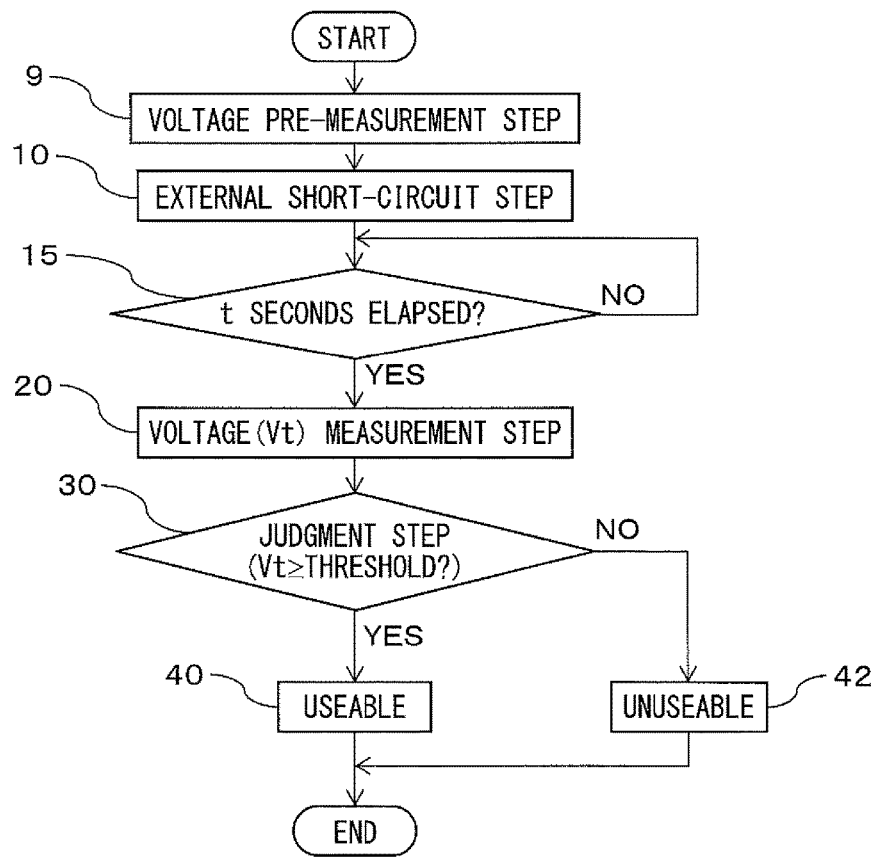
FIG. 2 illustrates the flowchart of one embodiment of the inspection method of the present invention.

The inspection method of the present invention can be performed, for example, as follows. First, a constituent unit cell is manufactured in a constituent unit cell manufacturing step. Thereafter, as shown in FIG. 2, (20) a voltage pre-measurement step of measuring an open-circuit voltage (V) between the positive electrode and the negative electrode of the constituent unit cell before an external short circuit is performed, (10) an external short circuit step of externally short-circuiting the positive electrode and the negative electrode of the constituent unit cell is then performed, and (20) a voltage measurement step of measuring an open-circuit voltage (Vt) between the positive electrode and the negative electrode of the constituent unit cell is performed after (15) a given time has elapsed (after t seconds) since the end of the external short circuit step. Subsequently, in the judgment step (30), whether the open-circuit voltage (Vt) measured in the voltage measurement step is less than the threshold value or not is judged. A constituent unit cell where the open-circuit voltage (Vt) is less than the threshold value is eliminated as unusable (42). Constituent unit cells where the open-circuit voltage (Vt) is not less than the threshold value are judged to be usable (40) and multi-layered in a later step to make an all-solid secondary battery.

Although not wishing to be bound by principle, the principle of action of the present invention is considered as follows.

A constituent unit cell of an all-solid secondary battery has a given voltage (potential difference) between the positive electrode and the negative electrode of the constituent unit cell due to natural potentials that respective materials of the positive electrode and the negative electrode originally have. This voltage can be temporarily made 0 V by forming an external short circuit between the positive electrode and the negative electrode of the constituent unit cell. With the elapse of a given time after the end of external short circuit, the voltage recovers to the original value. However, when a minor short circuit is present inside a constituent unit cell, electrons move from the negative electrode to the positive electrode through this portion, and the recovery takes more time than in the absence of a minor short circuit. As the level of minor short circuit inside a constituent unit cell is higher, a larger number of electrons move and in turn, the recovery takes much more time.

Therefore, the presence or absence and the level of minor short circuit can be known by checking the voltage recovery state at a given time after an external short circuit is once formed between the positive electrode and the negative electrode of the constituent unit cell.

<(A) Measuring an Open-Circuit Voltage>

Measuring an open-circuit voltage (V) between the positive electrode and the negative electrode of the constituent unit cell is performed. The method for measuring the voltage is not particularly limited as long as the open-circuit voltage between the positive electrode and the negative electrode of the constituent unit cell can be measured. For example, in the case of performing the measurement on a constituent unit cell having a structure illustrated in FIG. 1, the voltage can be measured by connecting a voltmeter to the positive electrode current collector and the negative electrode current collector. The threshold value used in the judgment step can be determined based on the open-circuit voltage measured in the voltage pre-measurement step.

<(B) Externally Short-Circuiting>

Externally Short-Circuiting for forming an external short circuit between the positive electrode and the negative electrode of the constituent unit cell is performed. The method for forming an external short circuit is not particularly limited. For example, in the case of a constituent unit cell having a structure illustrated in FIG. 1, the external short circuit can be formed by putting a conductor into contact with the positive electrode current collector and the negative electrode current collector. The time for the external short circuit is not particularly limited but is preferably shorter in view of inspection efficiency. After the voltage between the positive electrode and the negative electrode is made 0 V by the external short circuit, needless to say, the contact of the conductor with the positive electrode current collector and the negative electrode current collector is ended.

<(C) Measuring an Open-Circuit Voltage (after B)>

Measuring an open-circuit voltage (Vt) between the positive electrode and the negative electrode of the constituent unit cell is performed after a given time (t seconds) has elapsed since the end of the externally short-circuiting. The method for measuring the voltage is not particularly limited as long as the open-circuit voltage between the positive electrode and the negative electrode of the constituent unit cell can be measured. For example, the measurement can be performed by the same method as the measurement before externally short-circuiting. It is sufficient if an open-circuit voltage (Vt) after the elapse of a given time (after t seconds) is measured, and the open-circuit voltage may also be continuously measured soon after the end of external short circuit.

<(D) Judging>

Judging whether the open-circuit voltage (Vt) measured after externally short-circuiting is less than the threshold value or not is performed. The threshold value is a value for judging whether the presence or absence and the level of minor short circuit in a constituent unit cell are suitable for the manufacture of an all-solid secondary battery intended to manufacture, and can be previously determined according to the performance of an all-solid secondary battery intended to manufacture.

When the open-circuit voltage (Vt) measured after externally short-circuiting is less than the threshold value, the constituent unit cell is judged to be finely short-circuited and is decided to have no performance suitable for an all-solid secondary battery to be manufactured, and be unusable for the manufacture. Here, the constituent unit cell judged to be unusable in this judging is merely judged not to satisfy the performance as a constituent unit cell used for an all-solid secondary battery intended to manufacture and may be used for the manufacture of another all-solid secondary battery.

The determination of the threshold value is not particularly limited as long as it is a determination capable of distinguishing the presence or absence of a minor short circuit. For example, the threshold value can be determined as follows.

Figure 3:
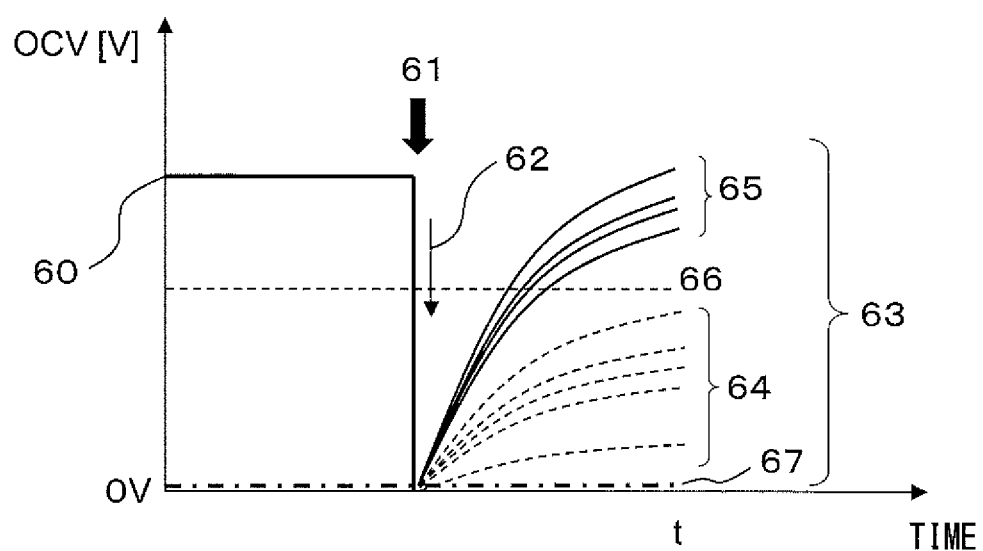
FIG. 3 illustrates the principle of the judgment step in the inspection method of the present invention.

As shown in FIG. 3, first, an open-circuit voltage between the positive electrode and the negative electrode of a constituent unit cell before external short circuit is measured. Thereafter, an external short circuit (61) is formed between the positive electrode and the negative electrode of the constituent unit cell, and the voltage between the positive electrode and the negative electrode of the constituent unit cell is made 0V by the voltage drop (62) due to the external short circuit. After the end of external short circuit, the open-circuit voltage recovers to the original voltage according to a recovery curve (63) illustrated in FIG. 2. This operation is repeated on a plurality of constituent unit cells, and the value of open-circuit voltage (Vt) between the positive electrode and the negative electrode after the elapse of a given time is obtained for the plurality of constituent unit cells.

Each constituent unit cell is completed as a single-cell battery, initially charged and then subjected to self-discharge inspection, and a judgment reference value capable of distinguishing, in the results of the self-discharge inspection, the value (64) of the open-circuit voltage of a constituent unit cell constituting the single-cell battery judged to be finely short-circuited and the value (65) of the open-circuit voltage of a constituent unit cell constituting a single-cell battery judged not to be finely short-circuited is provided, which can be determined as the threshold value (66). Even if the constituent unit cells are manufactured to the same specification, there is a slight difference in the natural potential among constituent unit cells and therefore, the threshold value can be determined as different values according to the open-circuit voltage before external short circuit.

In the case where an internal short circuit (67) exists in the constituent unit cell, the open-circuit voltage is 0 V before the external short circuit step and remains at 0 V after the elapse of a given time. For example, the threshold value can be determined as particular percentage of the open-circuit voltage before external short circuit.

In this example, the value of the open-circuit voltage between the positive electrode and the negative electrode can be measured by the same method as that employed in the above-described voltage measurement step. In addition, the self-discharge inspection can be performed by known self-discharge inspection.

(2) All-Solid Secondary Battery as Inspection Target

The structure of an all-solid secondary battery as a target of the inspection method of the present invention is described below. The constituent unit cell has, in order, a cathode active material layer, a solid electrolyte layer, and an anode electrolyte layer and may further has a positive electrode current collector and/or an negative electrode current collector.

Figure 1:
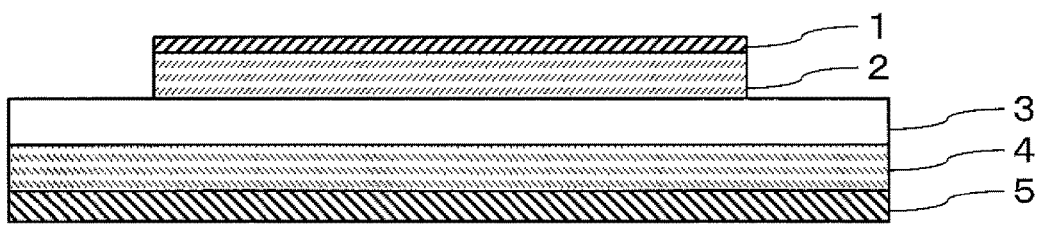
FIG. 1 illustrates an example of the constituent unit cell of an all-solid secondary battery targeted by the inspection method of the present invention.

Configuration examples of the constituent unit cell include a configuration having, in order, a positive electrode current collector (1), a cathode active material layer (2), a solid electrolyte layer (3), an anode electrolyte layer (4), and an negative electrode current collector (5) (FIG. 1).

<Cathode Active Material Layer>

The cathode active material layer contains a cathode active material, a solid electrolyte, and a binder and may further contain an electroconductive aid.

The cathode active material is not particularly limited as long as it can store/release a metal ion such as lithium ion, and a known cathode active material can be used. Examples thereof include a metal oxide containing lithium and at least one transition metal selected from manganese, cobalt, nickel and titanium, such as lithium cobaltate ($Li_xCoO_2$), lithium nickelate ($Li_xNiO_2$) and lithium nickel cobalt manganate ($Li_{1+x}Ni_{1/3}Co_{1/3}Mn_{1/3}O_2$), and a combination thereof.

The solid electrolyte is not particularly limited as long as it is a solid electrolyte having lithium ion conductivity, but the solid electrolyte may be a sulfide solid electrolyte. The sulfide solid electrolyte includes, for example, those prepared by mixing $Li_2S$ and $P_2S_5$. The mixing ratio of $Li_2S$ and $P_2S_5$ is, as the mass ratio of $Li_2S:P_2S_5$, preferably between 50:50 and 100:0 and may be 70:30.

The binder is not particularly limited but includes a polymer resin, for example, polyvinylidene fluoride (PVDF), polytetrafluoroethylene (PTFE), polyimide (PI), polyamide (PA), polyamideimide (PAI), butadiene rubber (BR), styrene butadiene rubber (SBR), nitrile-butadiene rubber (NBR), styrene-ethylene-butylene-styrene block copolymer (SEBS) or carboxymethyl cellulose (CMC), or a combination thereof. In view of high-temperature durability, the binder is preferably polyimide, polyamide, polyamideimide, polyacryl, carboxymethyl cellulose, etc., or a combination thereof.

The electroconductive aid includes a carbon material such as VGCF, acetylene black or Ketjen black, a metal such as nickel, aluminum or SUS, or a combination thereof.

The thickness of the cathode active material layer is not particularly limited but is preferably, for example, 0.1 µm or more and 1,000 µm or less.

<Solid Electrolyte Layer>

The solid electrolyte layer contains a solid electrolyte and a binder. The solid electrolyte is not particularly limited, and a known solid electrolyte usable for a battery can be used. For example, a solid electrolyte for use in the cathode active material layer above can be used. The binder is not particularly limited, but butadiene rubber (BR) may be used. The thickness of the electrolyte layer greatly varies depending on the kind of electrolyte, the configuration of battery, etc. but is, for example, 0.1 µm or more and 1,000 µm or less and may be 800 µm or less, 500 µm or less, or 300 µm or less.

<Anode Active Material Layer>

The anode active material layer contains an anode active material, a solid electrolyte, and a binder and may further contain an electroconductive aid.

The anode active material is not particularly limited as long as it can store/release a metal ion such as lithium ion, but the anode active material includes a metal such as Li, Sn, Si or In, an alloy of Li and Ti, Mg or Al, a carbon material such as hard carbon, soft carbon or graphite, or a combination thereof.

As the electroconductive aid, binder and solid electrolyte of the anode active material layer, the materials recited with respect to the cathode active material layer may be used.

The thickness of the anode active material is not particularly limited but is preferably, for example, 0.1 µm or more and 1,000 µm or less.

<Current Collector>

The current collector includes a positive electrode current collector or an negative electrode current collector. The raw material of the positive electrode current collector or negative electrode current collector is not particularly limited, and various metals such as SUS, Cu, Ni, Cr, Au, Pt, Al, Fe, Ti, Co or Zn, or an alloy thereof may be used. As the raw material of the positive electrode current collector, in view of chemical stability, SUS, Ni, Cr, Au, Pt, Al, Fe, Ti, Zn, etc. are preferred, and Al is more preferred. As the raw material of the negative electrode current collector, in view of chemical stability, SUS, Cu, Ni, Fe, Ti, Co, Zn, etc. are preferred, and Cu is more preferred.

2. Manufacturing Method (1) Manufacturing Method of all-Solid Secondary Battery of the Present Invention The manufacturing method of an all-solid secondary battery of the present invention is a method for manufacturing an all-solid secondary battery, including stacking a plurality of constituent unit cells excluding a constituent unit cell judged to be unusable by the judgment method of the present invention.

(2) Example of the Embodiment of Manufacturing Method

<Conventional Method and Example Thereof>

Figure 4:
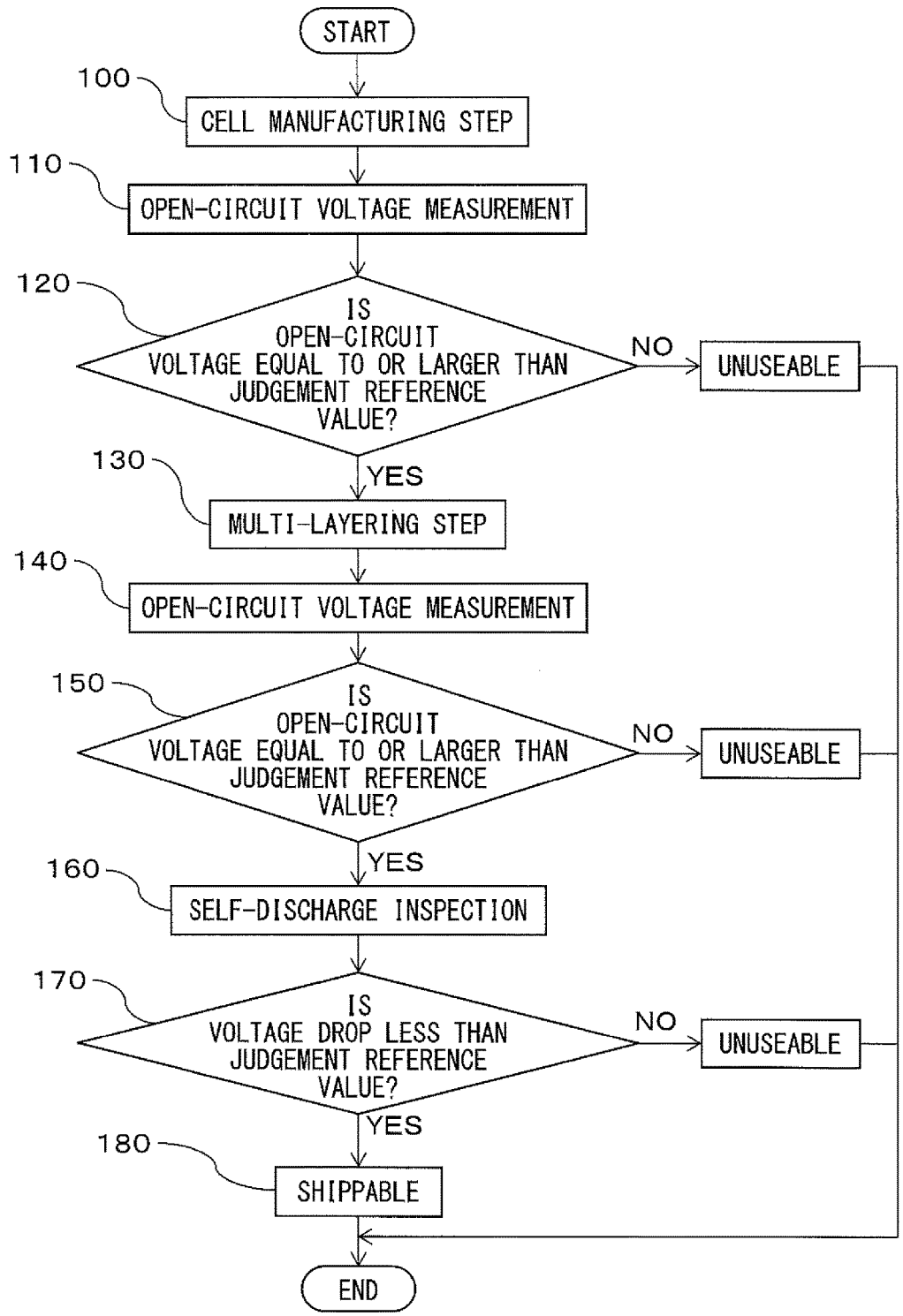
FIG. 4 illustrates the flowchart of one example of the conventional manufacturing process of a solid secondary battery.

FIG. 4 illustrates an example of the flowchart of the conventional manufacturing method of an all-solid secondary battery.

As in FIG. 4, in the conventional manufacturing method, after manufacturing a constituent unit cell in the constituent unit cell manufacturing step (100), the open-circuit voltage measurement (110) between the positive electrode and the negative electrode of a constituent unit cell is performed, and whether the measured open-circuit voltage is not less than the open-circuit voltage judgment reference value (120) is judged. A constituent unit cell where the measured open-circuit voltage is more than the open-circuit voltage judgment reference value (120) is eliminated from the manufacturing process. In this inspection, the presence or absence of an internal short circuit is judged by measuring the potential difference that respective materials of the positive electrode and the negative electrode of the constituent unit cell originally have. Specifically, this inspection is performed by measuring the open-circuit voltage between the positive electrode and the negative electrode of the constituent unit cell by means of a voltmeter, etc.

Thereafter, constituent unit cells are multi-stacked in the multi-layering step (130) to complete an all-solid secondary battery. After completing an all-solid secondary battery, open-circuit voltage measurement (140) is performed so as to inspect whether a short circuit is produced or not in the battery in the multi-layering step. An all-solid secondary battery where the open-circuit voltage is less than the judgment reference value is eliminated from the manufacturing process. In this inspection, whether an internal short circuit exists in the battery is inspected by measuring the open-circuit voltage between the positive electrode and the negative electrode of the completed all-solid secondary battery. This inspection is performed in case an internal short circuit is produced in the battery at the time of manufacture of an all-solid secondary battery in the multi-layering step.

Furthermore, self-discharge inspection (160) is performed to inspect the presence or absence of a minor short circuit of the all-solid secondary battery and when the voltage drop is less than the voltage drop judgment reference value (170), the battery is decided to be shippable (180). In the self-discharge inspection, for example, the completed battery is charged and then left standing for a given time, and the self-discharge amount is measured, whereby the presence or absence of a minor short circuit can be measured. The method for self-discharge inspection is not limited, and a known inspection method is used.

<Method in One Embodiment of the Present Invention>

Figure 5:
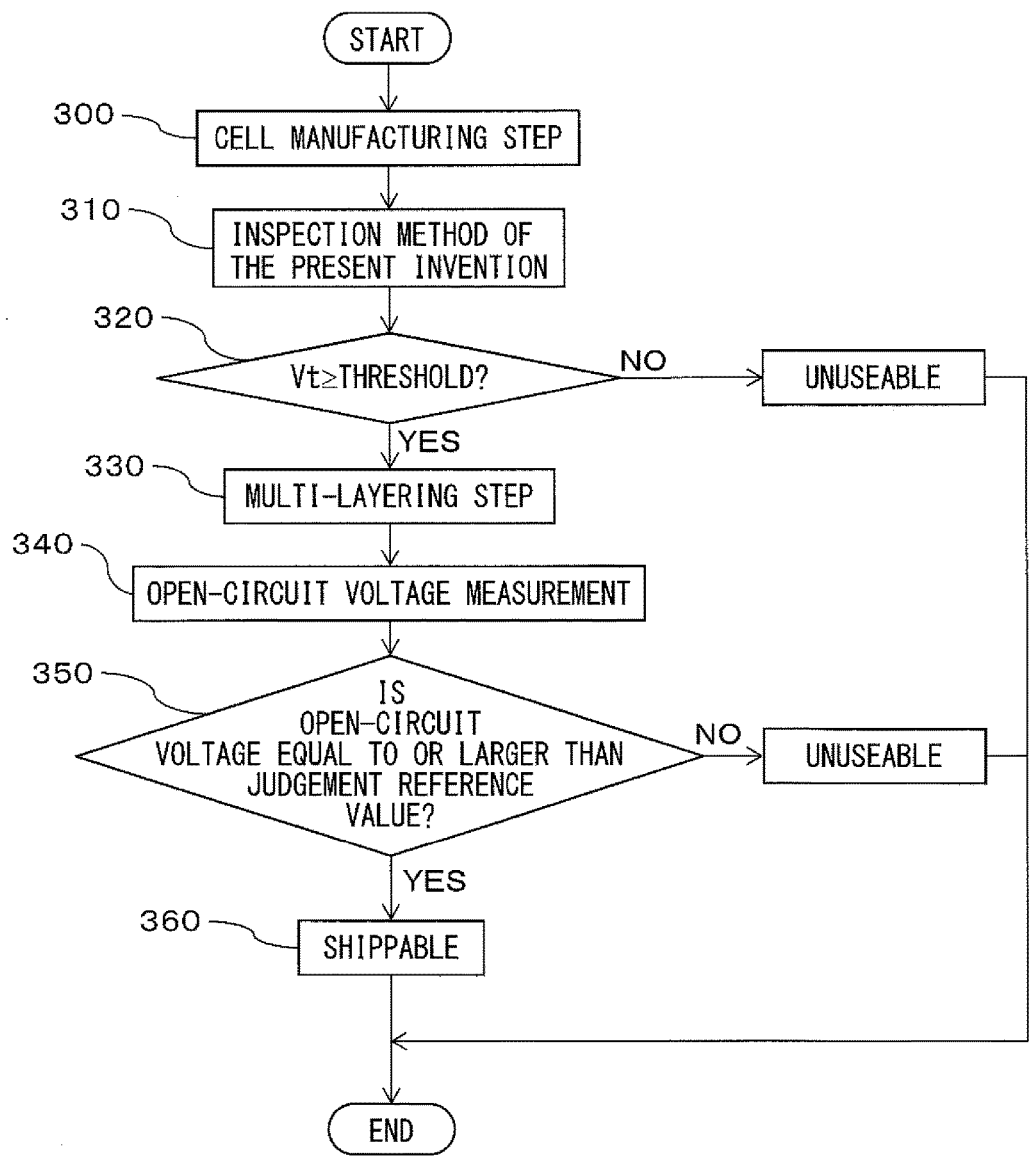
FIG. 5 illustrates the flowchart of one embodiment of the manufacturing method of the present invention.

FIG. 5 illustrates one embodiment of the present invention.

In the embodiment illustrated in FIG. 5, first, after the manufacture of a constituent unit cell in the constituent unit cell manufacturing step (300), the inspection method of the present invention (310) is performed. In this inspection method, a constituent unit cell where the open-circuit voltage (Vt) after the elapse of a given time (after t seconds) is judged to be less than the threshold value, is eliminated as unusable from the production process. Thereafter, constituent unit cells in which the voltage is judged to be not less than the threshold value in the inspection method of the present invention, are multi-stacked (330) to complete an all-solid secondary battery.

In the open-circuit voltage inspection (340) performed after completing an all-solid secondary battery, the open-circuit voltage between the positive electrode and the negative electrode of the completed all-solid secondary battery is measured. In this inspection, whether an internal short circuit is present or not in the completed all-solid secondary battery is inspected. As a result of the open-circuit voltage inspection, an all-solid secondary battery where the voltage is not less than the open-circuit voltage judgment reference value is decided to be shippable (360).

The inspection method of the present invention is preferably performed for all constituent unit cells manufactured, but for the purpose of streamlining manufacturing, a method where the inspection is performed on a given number of samples with respect to a certain production lot and the decision as to whether usable or unusable is made over all constituent unit cells of the production lot, may also be employed.

In the conventional method, the open-circuit voltage of the constituent unit cell is measured before the multi-stacking step. In this method, whether an internal short circuit is present or not in the constituent unit cell can be judged, but a minor short circuit cannot be judged. In the case where an internal short circuit is present in a constituent unit cell, a short circuit is formed between the positive electrode and the negative electrode of the constituent unit cell and since the open-circuit voltage becomes 0 V, it is easy to measure the presence or absence of an internal short circuit by measuring the open-circuit voltage. However, when a minor short circuit exists in the constituent unit cell, albeit in the absence of an internal short circuit, the voltage does not become 0 V. Therefore, the presence or absence and the level of minor short circuit in the constituent unit cell cannot be decided by simply measuring only the open-circuit voltage of the constituent unit cell.

For this reason, in the conventional method, a constituent unit cell having a minor short circuit cannot be excluded before the multi-stacking step, and an all-solid secondary battery has been manufactured by multi-stacking also a constituent unit cell with a minor short circuit, as a result, a constituent unit cell without a minor short circuit is wasted, resulting in poor productivity. In the manufacturing method of the present invention, unlike the conventional manufacturing method, the method of the present invention capable of judging the presence or absence of a minor short circuit in a constituent unit cell before completing an ail-solid secondary battery is added, so that a constituent unit cell with a minor short circuit can be excluded before entering the multi-stacking step and an all-solid secondary battery can be manufactured by multi-stacking only constituent unit cells each free of a minor short circuit.

EXAMPLES

Example 1

(1) Fabrication of Constituent Unit Cell

The constituent unit cell used for demonstrating the method and the manufacturing method of the present invention was fabricated by a method where a positive electrode mixture slurry, an negative electrode mixture slurry, and a solid electrolyte slurry are prepared, the positive electrode mixture slurry is applied onto an Al foil as a positive electrode current collector and dried, the negative electrode mixture slurry is applied onto a Cu foil as an negative electrode current collector and dried, a solid electrolyte layer is transferred therebetween, and the laminate is pressed. More specifically, the fabrication method is as follows.

i. Preparation of Positive Electrode Mixture Slurry

A slurry obtained by weighing and thoroughly mixing 52 g of $LiNi_{0.33}Co_{0.33}Mn_{0.33}O_2$ having an average particle diameter D50 of 5 μm (Nichia Corporation), VGCF (Showa Denko), 17 g of sulfide solid electrolyte, 2 g of binder (PVDF), and 52 g of butyl butyrate (Wako Pure Chemical) was used as the Positive Electrode Mixture Slurry. Here, the surface of $LiNi_{0.33}Co_{0.33}Mn_{0.33}O_2$ as the cathode active material was previously coated with $LiNbO_3$.

ii. Preparation of Negative Electrode Mixture Slurry

A slurry obtained by weighing and mixing 36 g of graphite, 25 g of sulfide solid electrolyte, 2 g of binder and 42 g of butyl butyrate (Wako Pure Chemical) was used as the anode mixture.

iii. Preparation of Solid Electrolyte Slurry

A slurry obtained by thoroughly mixing 25 g of sulfide solid electrolyte, 1 g of binder and 25 g of dehydrated heptane was used as the solid electrolyte slurry.

iv. Fabrication of Constituent Unit Cell

The positive electrode mixture slurry was applied onto an Al foil, dried and then cut. The negative electrode mixture slurry was applied onto a Cu foil, dried and then cut. The solid electrolyte slurry was applied onto a substrate, dried and then cut to form a solid electrolyte layer. The solid electrolyte layer composed of sulfide solid electrolyte was transferred between a material formed by applying the positive electrode mixture slurry onto an Al foil, drying the slurry and cutting the foil, and a material formed by applying the negative electrode mixture slurry onto a Cu foil, drying the slurry and cutting the foil, and the material formed by applying the positive electrode mixture slurry onto an Al foil, drying the slurry and cutting the foil, the material formed by applying the negative electrode mixture slurry onto a Cu foil, drying the slurry and cutting the foil, and the solid electrolyte layer were pressed to fabricate a constituent unit cell.

(2) Verification of Inspection Method of the Present Invention

In order to verify the effectiveness of the inspection method of the present invention, OCV inspection before external short circuit and the inspection of the present invention were performed in this order for the constituent unit cell, self-discharge inspection of a single-cell battery completed using the constituent unit cell was thereafter performed, and the results of each inspections were compared. In this verification, self-discharge inspection was performed after completing a constituent unit cell as a single-cell battery. The reason therefor is that the constituent unit cell used for this verification is a lithium ion battery and undergoes deterioration of the performance upon long-time contact with the outside air and therefore, it is not realistic to subject the constituent unit cell to self-discharge inspection in which a long time is required for the inspection.

i. Open-Circuit Voltage Inspection Before External Short Circuit

The open-circuit voltage was measured by connecting a voltmeter between the positive electrode current collector and the negative electrode current collector of the constituent unit cell. Out of constituent unit cells, some had an open-circuit voltage value larger than 0V, and some had 0 V. The constituent unit cells in which the open-circuit voltage was 0 V were designated as first group.

ii. Inspection of the Present Invention

After the measurement of open-circuit voltage before external short circuit, the positive electrode current collector and the negative electrode current collector of the constituent unit cell were connected by a conductor to form an external short circuit. After the external short circuit ended, a voltmeter was connected between the positive electrode current collector and the negative electrode current collector of the constituent unit cell, and the open-circuit voltage after 30 seconds since the end of external short circuit was measured.

In the constituent unit cells of first group having an open-circuit voltage of 0 V, the open-circuit voltage was 0 V also in the measurement method of the present invention. Other constituent unit cells included those where the open-circuit voltage after the elapse of 30 seconds was not less than the threshold value and those where less than the threshold value. The constituent unit cells in which the open-circuit voltage was less than the threshold value were designated as second group, and the constituent unit cells in which the open-circuit voltage was not less than the threshold value were designated as third group.

iii. Fabrication of Single-Cell Battery

With respect to the constituent unit cells of second and third groups, a single-cell battery was fabricated by performing ultrasonic welding of a current collecting tab and a cell terminal and vacuum sealing with an aluminum laminate film.

iv. Self-Discharge Inspection

Each of the batteries of second and third groups was subjected to self-discharge inspection. A specific method for the self-discharge inspection is as follows. Incidentally, as for the battery of first group, self-discharge inspection of a single-cell battery was not performed, because an internal short circuit is present in the constituent unit cell of first group and even if a single-cell battery is formed and initially charged, the battery cannot be charged to a predetermined voltage.

A battery charger and a voltage sensor were connected to a single-cell battery and while monitoring the voltage between the positive electrode and the negative electrode of the single-cell battery, charging to the upper limit voltage was performed in CC mode (constant current mode). After the battery charging, the single-cell battery was discharged in CC mode for a predetermined time and then charged in CCCV mode (constant-current constant-voltage mode) until reaching a predetermined voltage, thereby stabilizing the voltage of the battery. This process was taken because the voltage of battery immediately after charging is unstable and the battery cannot be directly subjected to self-discharge inspection.

Thereafter, the open-circuit voltage (V1) was measured as an initial voltage. The battery was then left standing at ordinary temperature of about 25° C. for 30 hours and thereby self-discharged and subsequently, the open-circuit voltage (V2) was measured. The voltage difference (V1−V2) between before and after self-discharge over 30 hours was calculated and compared with a previously decided threshold value for self-discharge inspection. It was judged that a minor short circuit is not present in the battery when the difference (V1−V2) is less than the threshold value for self-discharge inspection, and judged that a minor short circuit exists in the battery when the difference (V1−V2) is not less than the threshold value for self-discharge inspection.

The results of respective inspections, i.e., the open-circuit voltage inspection before external short circuit, the inspection of the present invention, and the self-discharge inspection for a single-cell battery, are shown together in Table 1.

TABLE 1

|  | First Group | Second Group | Third Group |
| --- | --- | --- | --- |
| Open-circuit voltage inspection before external short circuit | B | A | A |
| Inspection of the present invention | B | B | A |
| Self-discharge inspection for single-cell battery | — | B | A |

In Table 1, the results of each inspection of Example 1 are compared. In the Table, "A" indicates that the judgment criteria are satisfied in the inspection, and "B" indicates that the judgment criteria are not satisfied. In the open-circuit voltage inspection before external short circuit, the rating is "A" when the open-circuit voltage measured is not less than the judgment reference value, and is "B" when it is less than the judgment reference value. In the inspection of the present invention, the rating is "A" when the open-circuit voltage (Vt) measured is not less than the threshold value, and is "B" when it is less than the threshold value. In the self-discharge inspection for a single-cell battery, the rating is "A" when the voltage difference (V1−V2) between before and after self-discharge over 30 hours is less than the threshold value for self-discharge inspection, and is "B" when the difference (V1−V2) is not less than the threshold value for self-discharge inspection. Here, "−" indicates that the inspection is not performed.

The constituent unit cell of first group does not satisfy the judgment criteria in both the open-circuit voltage inspection before external short circuit and the inspection of the present invention. This reveals that the constituent unit cell in which an internal short circuit is decided to exist in the constituent unit cell in the open-circuit voltage inspection before external short circuit is judged to be unusable also in the inspection of the present invention.

The constituent unit cells of second and third groups satisfy the judgment criteria in the open-circuit voltage inspection before external short circuit, but in the inspection of the present invention and the self-discharge inspection for a single-cell battery, only the constituent unit cell of third group satisfies the judgment criteria. This reveals that in the inspection of the present invention, a minor short circuit undetectable by the open-circuit voltage inspection before external short circuit can be detected.

Example 2

In order to verify the manufacturing method of the present invention, an all-solid secondary battery of a multi-stacked type was manufactured by the manufacturing method of the present invention and subjected to self-discharge inspection, and it was confirmed that a minor short circuit is not present in the manufactured all-solid secondary battery. Specifically, the verification was performed by the following method.

A constituent unit cell was fabricated by the method of Example 1. Thereafter, the positive electrode current collector and the negative electrode current collector of the constituent unit cell were connected by a conductor to form an external short circuit. After the external short circuit ended, a voltmeter was connected between the positive electrode current collector and the negative electrode current collector of the constituent unit cell, and the open-circuit voltage after 30 seconds since the end of external short circuit was measured. As a result of the measurement, a constituent unit cell with the open-circuit voltage being less than the threshold value was excluded, and other constituent unit cells were stacked. Thereafter, an all-solid secondary battery of Example 2 was manufactured by performing ultrasonic welding of a current collecting tab and a cell terminal and vacuum sealing with an aluminum laminate film.

The manufactured all-solid secondary battery was subjected to self-discharge inspection in the same manner as in the method of (2), iv. above.

As a result of self-discharge inspection, it was judged that a minor short is not present in all of the all-solid secondary batteries formed.

From these results, it is understood that an all-solid secondary battery having multi-stacked therein only constituent unit cells each free of a minor short circuit can be manufactured by the manufacturing method of the present invention.

INDUSTRIAL APPLICABILITY

When the present invention is utilized, an all-solid secondary battery can be efficiently manufactured and the manufacturing cost of an all-solid secondary battery can be reduced.

DESCRIPTION OF NUMERICAL REFERENCES

1 Positive electrode current collector
2 Cathode active material layer
3 Solid electrolyte layer
4 Anode active material layer
5 Negative electrode current collector
60 Open-circuit voltage before external short circuit
61 External short circuit
62 Usable
63 Threshold value
64 Unusable
65 Internal short circuit
66 Voltage drop due to external short circuit
67 Recovery curve

What is claimed is:

1. A method for inspecting a constituent unit cell to be stacked in an all-solid secondary battery before forming said all-solid secondary battery, comprising:
   (A) measuring an open-circuit voltage between the positive electrode and the negative electrode of said constituent unit cell before a short-circuiting step is performed,
   (B) temporarily short-circuiting the positive electrode and the negative electrode of said constituent unit cell,
   (C) measuring an open-circuit voltage between the positive electrode and the negative electrode of said constituent unit cell after a given time has elapsed since the end of step (B), and
   (D) judging said constituent unit cell to be unusable when said open-circuit voltage measured in step (C) is less than a threshold value.

2. The method according to claim 1, wherein the electrolyte of said all-solid secondary battery is a sulfide solid electrolyte.

3. A method for manufacturing an all-solid secondary battery, comprising stacking a plurality of constituent unit cells excluding constituent unit cells judged to be unusable by the inspection method according to claim 1.

4. The method according to claim 1, wherein the threshold value is based on the open-circuit voltage measured in step (A).

* * * * *